(12) United States Patent
Nielson et al.

(10) Patent No.: US 10,534,120 B2
(45) Date of Patent: Jan. 14, 2020

(54) WIRE GRID POLARIZER WITH PROTECTED WIRES

(71) Applicant: Moxtek, Inc., Orem, UT (US)

(72) Inventors: R. Stewart Nielson, Pleasant Grove, UT (US); Mathew Free, Orem, UT (US); Bradley R. Williams, Pocatello, ID (US); Matthew R. Linford, Orem, UT (US); Anubhav Diwan, Provo, UT (US); Fred Lane, Salt Lake City, UT (US); Shaun Ogden, Saratoga Springs, UT (US)

(73) Assignee: Moxtek, Inc., Orem, UT (US)

( * ) Notice: Subject to any disclaimer, the term of this patent is extended or adjusted under 35 U.S.C. 154(b) by 282 days.

(21) Appl. No.: 15/631,256

(22) Filed: Jun. 23, 2017

(65) Prior Publication Data

US 2017/0293059 A1   Oct. 12, 2017

Related U.S. Application Data

(63) Continuation-in-part of application No. 15/613,985, filed on Jun. 5, 2017, now Pat. No. 10,025,015, which
(Continued)

(51) Int. Cl.
*G02B 5/30* (2006.01)
*G02B 1/14* (2015.01)
(Continued)

(52) U.S. Cl.
CPC ............ *G02B 5/3058* (2013.01); *B05D 1/60* (2013.01); *C09D 5/08* (2013.01); *C23C 14/02* (2013.01);
(Continued)

(58) Field of Classification Search
CPC ...... G02B 5/30; G02B 5/3025; G02B 5/3058; G02B 1/04; G02B 1/10; G02B 1/105;
(Continued)

(56) References Cited

U.S. PATENT DOCUMENTS 7,961,393 B2   5/2011 Perkins et al.
8,079,718 B1   12/2011 Zhai et al.
(Continued)

FOREIGN PATENT DOCUMENTS

DE   102012109704 A1   4/2014
WO   WO 2009/104861 A1   8/2009

OTHER PUBLICATIONS

Tsud et al.; "Vacuum vapour deposition of phenylphosphonic acid on amorphous alumina"; Surface Science; (2007); pp. 3060-3066; vol. 601; <doi: 10.1016/j.susc.2007.05.007 >.
(Continued)

*Primary Examiner* — Stephone B Allen
*Assistant Examiner* — Adam W Booher
(74) *Attorney, Agent, or Firm* — Thorpe, North & Western, LLP

(57) ABSTRACT

A wire grid polarizer and method of making a wire grid polarizer can protect delicate wires of the wire grid polarizer from damage. The wire grid polarizer can include a protective-layer located on an array of wires. The array of wires can further be protected by a chemical coating on an inside surface of the air-filled channels, closed ends of the air-filled channels, damaged wires of the array of wires in a line parallel to an edge of the wire grid polarizer, or combinations thereof. The method can include (i) providing the wire grid polarizer, (ii) applying the protective-layer, by physical vapor deposition or chemical vapor deposition but excluding atomic layer deposition, onto the array of wires, (iii) cutting
(Continued)

the wire grid polarizer wafer into multiple wire grid polarizer parts, then (iv) protecting the array of wires.

20 Claims, 5 Drawing Sheets

Related U.S. Application Data is a continuation of application No. 15/078,190, filed on Mar. 23, 2016, now Pat. No. 9,703,028, application No. 15/631,256, which is a continuation-in-part of application No. 15/078,495, filed on Mar. 23, 2016, now Pat. No. 10,054,717, and a continuation-in-part of application No. 15/078,549, filed on Mar. 23, 2016, now abandoned, and a continuation-in-part of application No. 15/078,753, filed on Mar. 23, 2016, now abandoned, and a continuation-in-part of application No. 15/078,695, filed on Mar. 23, 2016, now Pat. No. 9,995,864.

(60) Provisional application No. 62/375,675, filed on Aug. 16, 2016, provisional application No. 62/142,854, filed on Apr. 3, 2015, provisional application No. 62/190,188, filed on Jul. 8, 2015, provisional application No. 62/216,782, filed on Sep. 10, 2015, provisional application No. 62/209,024, filed on Aug. 24, 2015, provisional application No. 62/242,883, filed on Oct. 16, 2015, provisional application No. 62/265,773, filed on Dec. 10, 2015.

(51) Int. Cl.
| | | |
|---|---|---|
| *C09D 5/08* | (2006.01) | |
| *C23C 16/44* | (2006.01) | |
| *C23C 16/56* | (2006.01) | |
| *C23C 16/02* | (2006.01) | |
| *C23C 14/24* | (2006.01) | |
| *C23C 14/02* | (2006.01) | |
| *C23C 14/58* | (2006.01) | |
| *B05D 1/00* | (2006.01) | |
| *C23C 14/12* | (2006.01) | |
| *C23C 16/30* | (2006.01) | |
| *C23C 16/34* | (2006.01) | |
| *C23C 16/40* | (2006.01) | |
| *C23C 16/455* | (2006.01) | |
| *G02B 1/04* | (2006.01) | |
| *H04N 9/31* | (2006.01) | |
| *G02B 1/18* | (2015.01) | |
| *B05D 3/06* | (2006.01) | |
| *B05D 3/10* | (2006.01) | |
| *B05D 3/14* | (2006.01) | |
| *G03B 21/20* | (2006.01) | |

(52) U.S. Cl.
CPC .............. *C23C 14/12* (2013.01); *C23C 14/24* (2013.01); *C23C 14/58* (2013.01); *C23C 16/02* (2013.01); *C23C 16/308* (2013.01); *C23C 16/345* (2013.01); *C23C 16/401* (2013.01); *C23C 16/403* (2013.01); *C23C 16/405* (2013.01); *C23C 16/44* (2013.01); *C23C 16/45525* (2013.01); *C23C 16/56* (2013.01); *G02B 1/04* (2013.01); *G02B 1/14* (2015.01); *G02B 1/18* (2015.01); *H04N 9/3167* (2013.01); *B05D 3/062* (2013.01); *B05D 3/10* (2013.01); *B05D 3/142* (2013.01); *G03B 21/2073* (2013.01)

(58) Field of Classification Search
CPC ........ G02B 1/14; G02B 1/18; G02B 27/0006; G02B 27/28; B05D 1/60; B05D 3/062; B05D 3/10; B05D 3/14; B05D 3/141; B05D 3/142; C09D 5/08; C23C 14/00; C23C 14/02; C23C 14/12; C23C 14/22; C23C 14/24; C23C 14/58; C23C 16/00; C23C 16/02; C23C 16/30; C23C 16/308; C23C 16/34; C23C 16/345; C23C 16/40–409; C23C 16/44; C23C 16/45525; C23C 16/56; H04N 9/3167; H04N 9/3197; G03B 21/2073
See application file for complete search history.

(56) References Cited

U.S. PATENT DOCUMENTS

| | | |
|---|---|---|
| 8,576,672 B1 | 11/2013 | Peng et al. |
| 8,741,158 B2 | 6/2014 | Aytug et al. |
| 8,755,113 B2 | 6/2014 | Gardner et al. |
| 2002/0039594 A1 | 4/2002 | Unger |
| 2002/0135099 A1 | 9/2002 | Robinson et al. |
| 2003/0028469 A1 | 2/2003 | Bergman et al. |
| 2003/0102286 A1* | 6/2003 | Takahara ............... C03C 15/00 216/45 |
| 2003/0227678 A1 | 12/2003 | Lines et al. |
| 2005/0042553 A1 | 2/2005 | Lu et al. |
| 2005/0048288 A1 | 3/2005 | Flynn et al. |
| 2007/0252954 A1 | 11/2007 | McGuire, Jr. et al. |
| 2008/0131709 A1 | 6/2008 | Hanson et al. |
| 2008/0152892 A1 | 6/2008 | Edlinger et al. |
| 2008/0316599 A1 | 12/2008 | Wang et al. |
| 2009/0066885 A1 | 3/2009 | Kumai |
| 2009/0109377 A1* | 4/2009 | Sawaki ............... G02B 5/1814 349/96 |
| 2011/0096396 A1 | 4/2011 | Kaida et al. |
| 2011/0217560 A1 | 9/2011 | Ridgeway |
| 2012/0008205 A1 | 1/2012 | Perkins et al. |
| 2012/0251797 A1 | 10/2012 | Smith et al. |
| 2012/0319222 A1 | 12/2012 | Ozawa et al. |
| 2013/0250411 A1* | 9/2013 | Bangerter ............... G02B 5/30 359/483.01 |
| 2013/0319522 A1* | 12/2013 | Koike ............... H01L 31/02366 136/256 |
| 2013/0342794 A1 | 12/2013 | Okada et al. |
| 2014/0016197 A1 | 1/2014 | Davis |
| 2014/0295675 A1 | 10/2014 | Ikeuchi et al. |
| 2015/0062500 A1 | 3/2015 | Park et al. |
| 2015/0259256 A1 | 9/2015 | Urdl et al. |
| 2016/0062017 A1 | 3/2016 | Nielson et al. |
| 2016/0291208 A1 | 10/2016 | Wangensteen et al. |
| 2016/0291227 A1 | 10/2016 | Nielson et al. |
| 2017/0293059 A1 | 10/2017 | Nielson et al. |
| 2018/0052270 A1 | 2/2018 | Nielson et al. |
| 2018/0143364 A1 | 5/2018 | Wang et al. |
| 2018/0259698 A1 | 9/2018 | Nielson et al. |
| 2018/0267221 A1* | 9/2018 | Oowada ............... G02F 1/1335 |

OTHER PUBLICATIONS

International search report dated Dec. 20, 2017, in International Application No. PCT/US2017/052471, filed Sep. 20, 2017; 4 pages.
Accuratus; "Aluminum Oxide | Al$^2$O$^3$ Ceramic Properties;" Al2O3 Material Properties; (Jul. 29, 2016); 3 pages; [retrieved May 31, 2019]; Retrieved from <URL: https://accuratus.com/alumox.html >.
Institute for Microelectronics; "2.1 Silicon Dioxide Properties;" www.iue.tuwien.ac.at; (Jan. 21, 2013); 4 pages; [retrieved May 31, 2019]; Retrieved from <URl: www.iue.tuwien.ac.at/phd/filipovic/node26.html >.

* cited by examiner

WIRE GRID POLARIZER WITH PROTECTED WIRES

CLAIM OF PRIORITY

This application claims priority to U.S. Provisional Patent Application No. 62/375,675, filed on Aug. 16, 2016, which is incorporated herein by reference in its entirety.

This application is a continuation-in-part of U.S. patent application Ser. No. 15/613,985, filed on Jun. 5, 2017; which is a continuation of U.S. patent application Ser. No. 15/078,190, filed on Mar. 23, 2016; which claims priority to U.S. Provisional Patent Application Nos. 62/142,854, filed on Apr. 3, 2015; 62/190,188, filed on Jul. 8, 2015; 62/216,782, filed on Sep. 10, 2015; 62/209,024, filed on Aug. 24, 2015; 62/242,883, filed on Oct. 16, 2015; and 62/265,773, filed on Dec. 10, 2015; which are incorporated herein by reference in their entirety.

This application is also a continuation-in-part of U.S. patent application Ser. No. 15/078,495, filed on Mar. 23, 2016; Ser. No. 15/078,549, filed on Mar. 23, 2016; Ser. No. 15/078,753, filed on Mar. 23, 2016; and Ser. No. 15/078,695, filed on Mar. 23, 2016; each of which claims priority to U.S. Provisional Patent Application Nos. 62/142,854, filed on Apr. 3, 2015; 62/190,188, filed on Jul. 8, 2015; 62/216,782, filed on Sep. 10, 2015; 62/209,024, filed on Aug. 24, 2015; 62/242,883, filed on Oct. 16, 2015; and 62/265,773, filed on Dec. 10, 2015; which are incorporated herein by reference in their entirety.

FIELD OF THE INVENTION

The present application is related generally to wire grid polarizers.

BACKGROUND

Wire grid polarizers can be used to divide light into two different polarization states. One polarization state can pass through the wire grid polarizer and the other can be absorbed or reflected. The effectiveness or performance of wire grid polarizers is based on a very high percent transmission (e.g. high Tp) of one polarization (e.g. p-polarization) and minimal transmission (e.g. low Ts) of an opposite polarization (e.g. s-polarization). It can be beneficial to have high contrast (Tp/Ts). The percent reflection (Rs) of the opposite polarization (e.g. s-polarization) can also be an, important indicator of polarizer performance.

Wires of wire grid polarizers, especially for polarization of visible or ultraviolet light, can be small and delicate with nanometer-sized pitch, wire-width, and wire-height. Water can condense or drop only onto limited portions of a wire grid polarizer. Because the water can be in one channel but not in an adjacent channel, forces in the water can cause wires to topple over, thus damaging the wire grid polarizer. Wire grid polarizer performance can also degrade by corrosion. Water can condense onto the wire grid polarizer and wick into narrow channels between wires due to capillary action. The water can then corrode the wires. Corroded regions can have reduced contrast, changed Rs, or can fail to polarize at all. Wire grid polarizers can be damaged by handling. Wires can topple-over as a user handles the wire grid polarizer.

Wire grid polarizers are used in systems (e.g. computer projectors, semiconductor inspection tools, etc.) that require high performance. Small defects in the wire grid polarizer, such as corroded or collapsed wires, can significantly degrade system performance (e.g. distorted image from a computer projector). Therefore, it can be important to protect the wires.

SUMMARY

It has been recognized that it would be advantageous to protect delicate wires of wire grid polarizers from damage due to handling, corrosion, and other water damage to the wires. The present invention is directed to various embodiments of wire grid polarizers, and methods of protecting wires of wire grid polarizers, that satisfy these needs. Each embodiment may satisfy one, some, or all of these needs.

The wire grid polarizer can comprise an array of wires located on a surface of a substrate and an air-filled channel between adjacent wires. A protective-layer can be located over the array of wires and can span the air-filled channels. The protective-layer can provide structural-support for the array of wires and can cap the air-filled channels. The array of wires can be protected by a chemical coating on an inside surface of the air-filled channels, closed ends of the air-filled channels, damaged wires of the array of wires in a line parallel to an edge of the wire grid polarizer, or combinations thereof.

In one embodiment, the method of protecting wires of a wire grid polarizer can comprise: (1) providing an array of substantially-parallel, elongated wires located on a surface of a substrate, the array of wires forming an air-filled channel between adjacent wires, defining a wire grid polarizer wafer; (2) applying a protective-layer, by physical vapor deposition or chemical vapor deposition but excluding atomic layer deposition, onto the array of wires and spanning the air-filled channels to provide structural-support for the array of wires and to cap the air-filled channels; (3) cutting the wire grid polarizer wafer into multiple wire grid polarizer parts; and (4) protecting the array of wires of the wire grid polarizer parts by closing ends of the air-filled channels, coating an inside surface of the air-filled channels, damaging the array of wires in a line parallel to an edge of the wire grid polarizer parts, or combinations thereof.

In another embodiment, the method of protecting wires of a wire grid polarizer can comprise: (1) providing a wire grid polarizer wafer with an array of substantially-parallel, elongated wires located on a surface of a substrate, an air-filled channel between adjacent wires, and a protective-layer on the array of wires and spanning the air-filled channels, the protective-layer providing structural-support for the array of wires and capping the air-filled channels; (2) cutting the wire grid polarizer wafer into multiple wire grid polarizer parts; and (3) protecting the array of wires of the wire grid polarizer parts by closing ends of the air-filled channels, coating an inside surface of the air-filled channels, damaging the array of wires in a line parallel to an edge of the wire grid polarizer parts, or combinations thereof.

BRIEF DESCRIPTION OF THE DRAWINGS

Drawings Might Not Be Drawn to Scale

DEFINITIONS

Figure 1:
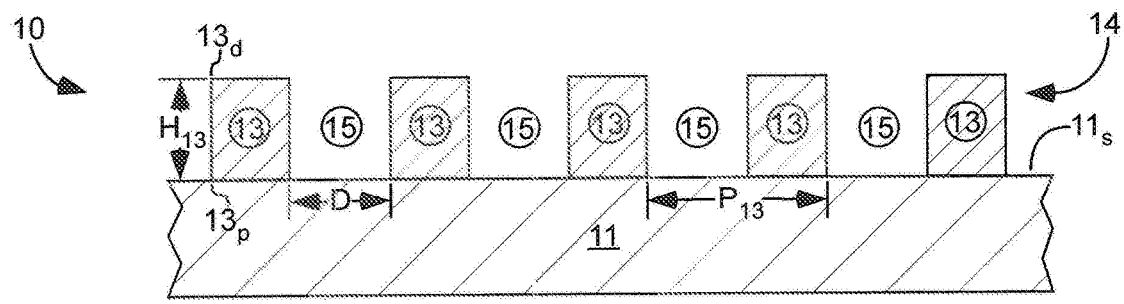
FIG. 1 is a schematic, cross-sectional side-view of a wire grid polarizer 10 comprising an array of wires 14 located on a surface of a substrate 11 and a plurality of air-filled channels 15, including an air-filled channel 15 between adjacent wires 13 of the array of wires 14, in accordance with an embodiment of the present invention.

As used herein, the term "located on" means located directly on or located above with some other solid material between.

As used herein, "alkyl" refers to a branched, unbranched, or cyclic saturated hydrocarbon group. Alkyls include, but are not limited to, methyl, ethyl, n-propyl, isopropyl, n-butyl, isobutyl, t-butyl, octyl, and decyl, for example, as well as cycloalkyl groups such as cyclopentyl, and cyclohexyl, for example. The "alkyl" can typically be relatively small to facilitate vapor deposition, if overall atomic weight of the molecule is considered, such as for example ≤2 carbon atoms in one aspect, ≤3 carbon atoms in another aspect, ≤5 carbon atoms in another aspect, or ≤10 carbon atoms in another aspect. As used herein, "substituted alkyl" refers to an alkyl substituted with one or more substituent groups. The term "heteroalkyl" refers to an alkyl in which at least one carbon atom is replaced with a heteroatom. If not otherwise indicated, the term "alkyl" includes unsubstituted alkyl, substituted alkyl, and heteroalkyl.

As used herein, "aryl" refers to a group containing a single aromatic ring or multiple aromatic rings that are fused together, directly linked, or indirectly linked (such that the different aromatic rings are bound to a common group such as a methylene or ethylene moiety). Aryl groups include, for example, phenyl, naphthyl, anthryl, phenanthryl, biphenyl, diphenylether, diphenylamine, and benzophenone. The term "substituted aryl" refers to an aryl group comprising one or more substituent groups. The term "heteroaryl" refers to an aryl group in which at least one carbon atom is replaced with a heteroatom. If not otherwise indicated, the term "aryl" includes unsubstituted aryl, substituted aryl, and heteroaryl.

As used herein, the phrase "bond to the wires" or similar phrases (e.g. "Z is a bond to the wires") can mean a direct bond between the chemical and the wires or a bond to an intermediate layer which is bonded directly, or through other layer(s) to the wires. Similarly, the phrase "bond to the protective-layer" or similar phrases (e.g. "Z is a bond to the protective-layer") can mean a direct bond between the chemical and the protective-layer or a bond to an intermediate layer which is bonded directly, or through other layer(s) to the protective-layer.

As used herein, the term "carbon chain" means a chain of carbon atoms linked together, including at least three carbon atoms in a row (e.g. —C—C—C—, —C=C—C—, etc.). The term carbon chain can include at least five carbon atoms in a row in one aspect, at least ten carbon atoms in a row in another aspect, or at least fifteen carbon atoms in a row in another aspect. The term carbon chain can also include ether linkages (C—O—C moieties). The term carbon chain includes single, double, and triple carbon to carbon bonds. The carbon atoms can be attached to any element or molecule.

As used herein, the term "substrate" includes a base material, such as for example a glass wafer. The term "substrate" includes a single material, and also includes multiple materials (e.g. layered, composite, or the like), such as for example a glass wafer with at least one thin film on a surface of the wafer used together as the base material.

DETAILED DESCRIPTION

Figure 2:
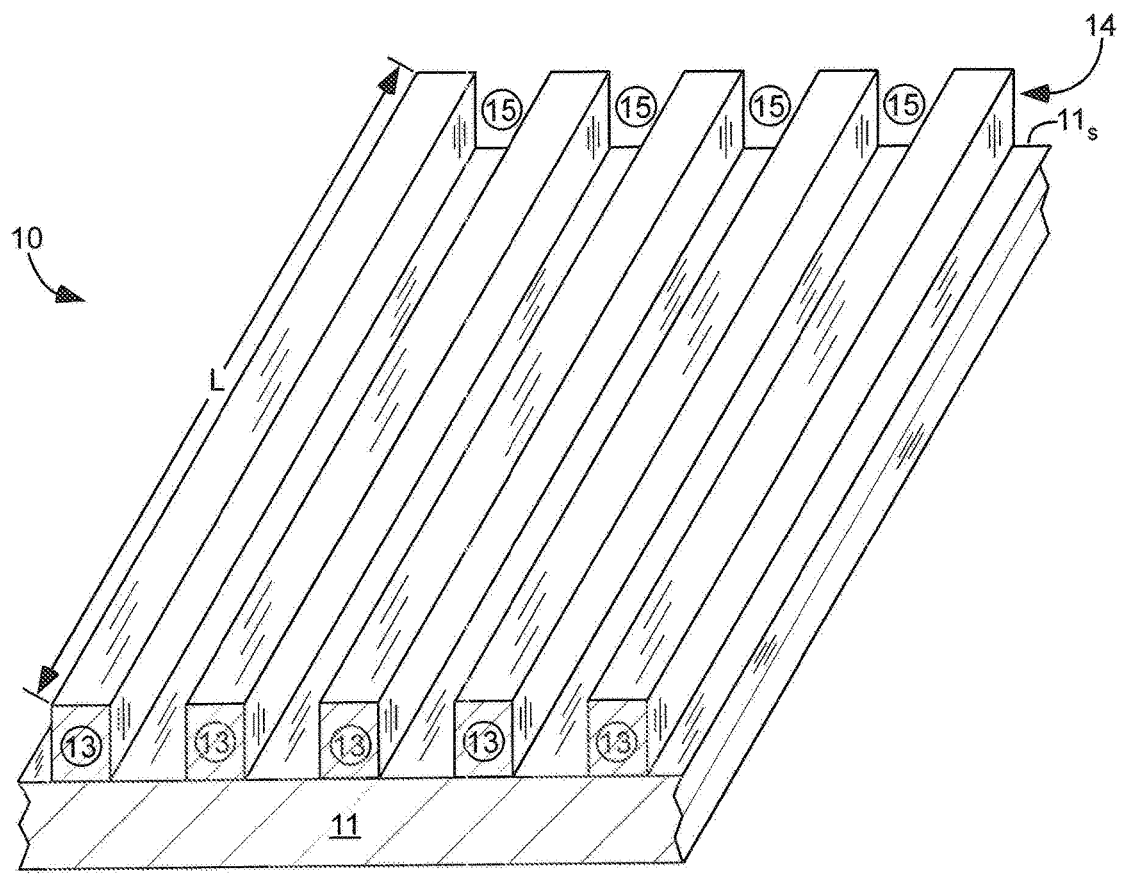
FIG. 2 is a schematic perspective-view of the wire grid polarizer 10 of FIG. 1, in accordance with an embodiment of the present invention.

As illustrated in FIGS. 1-2, a wire grid polarizer 10 is shown comprising an array of wires 14 located on a surface $11_s$ of a substrate 11. The array of wires 14 can be substantially-parallel and elongated. Each wire 13 of the array of wires 14 can have a length L parallel to the surface $11_s$ of the substrate 11 and a height $H_{13}$ that is perpendicular to the length L. The height $H_{13}$ can be substantially less than the length L. For example, the height $H_{13}$ can be less than 10% of the length L, less than 1% of the length L, or less than 0.1% of the length L. The array of wires 14 can have a proximal end $13_p$ of the height $H_{13}$ closer to the substrate 11 and a distal end $13_d$ of the height $H_{13}$ farther from the substrate 11. Each wire 13 can be made of or can include materials for polarization of light, including metals and/or dielectrics, as are typically used in wires of wire grid polarizers. See for example U.S. Pat. Nos. 7,961,393 and 8,755,113, which are incorporated herein by reference. The wires 13 can have a small pitch P, such as for example a pitch $P_{13}$ of less than 500 nanometers, less than 200 nanometers, less than 150 nanometers, or less than 125 nanometers.

The wire grid polarizer 10 can also include a plurality of air-filled channels 15, including an air-filled channel 15 between adjacent wires 13 of the array of wires 14.

Figure 3A:
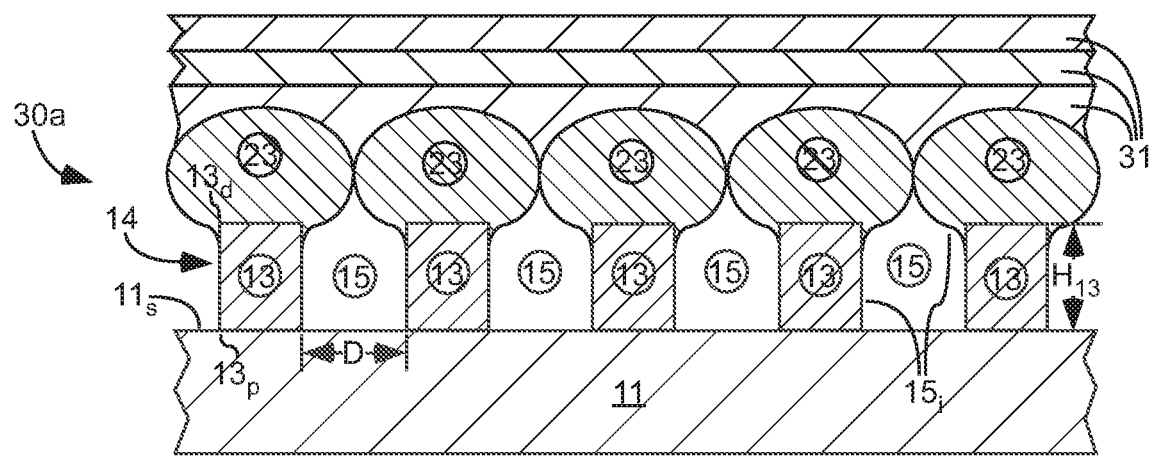
FIG. 3a is a schematic, cross-sectional side-view of a wire grid polarizer 30a in accordance with an embodiment of the present invention, similar to wire grid polarizer 10 of FIGS. 1-2, but further comprising (a) a protective-layer 23 located at a distal end $13_d$ of the array of wires 14 farther from the substrate 11 and spanning the air-filled channels 15; and (b) multiple thin-film layers 31 on the protective-layer 23.
Figure 3B:
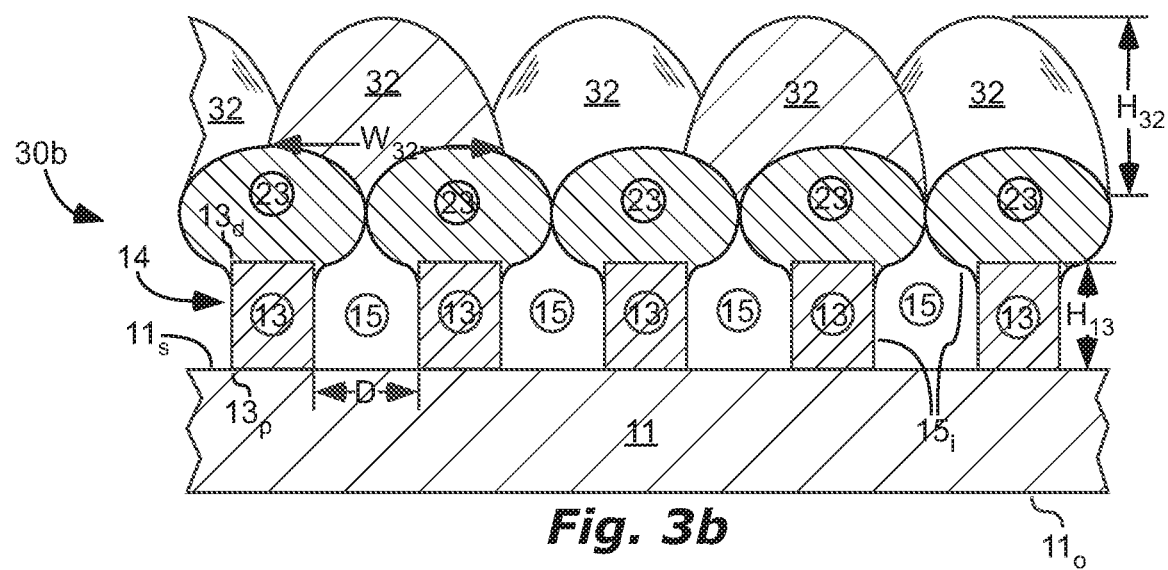
FIG. 3b is a schematic, cross-sectional side-view of a wire grid polarizer 30b in accordance with an embodiment of the present invention, similar to wire grid polarizer 30a of FIG. 3a, but with multiple protrusions 32 on the protective-layer 23.
Figure 4:
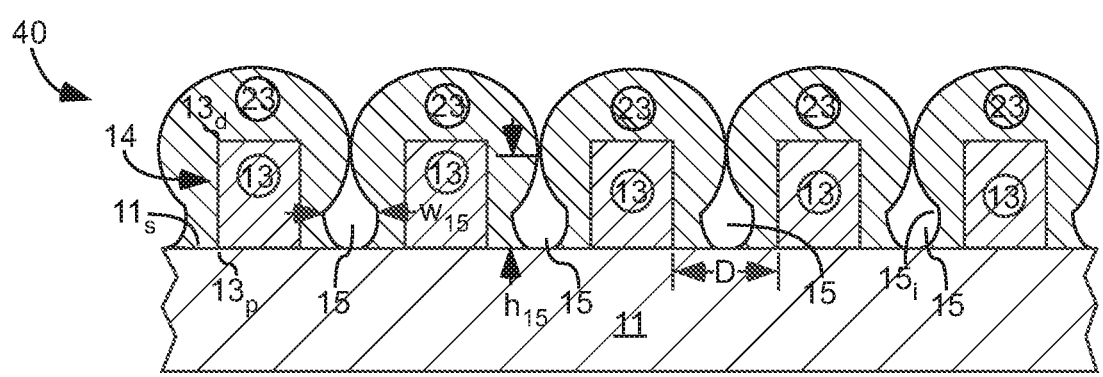
FIG. 4 is a schematic, cross-sectional side-view of a wire grid polarizer 40, similar to wire grid polarizer 10 of FIGS. 1-2, but further comprising a protective-layer 23 located at, a distal end $13_d$ of the array of wires 14 farther from the substrate 11 and spanning the air-filled channels 15, the protective-layer 23 also extending from the distal end $13_d$ of the array of wires 14 towards a proximal end $13_p$ of the array of wires 14 closer to the substrate 11, in accordance with an embodiment of the present invention.

As shown on wire grid polarizers 30a, 30b, and 40 in FIGS. 3a-4, a protective-layer 23 can be located at the distal end $13_d$ of the array of wires 14 and can span the air-filled channels 15. The protective-layer 23 can provide structural-support for the array of wires 14 and can cap the air-filled channels 15. The protective-layer 23 can be located exclusively or primarily at the distal end $13_d$ of the array of wires 14, as shown on wire grid polarizer 30a in FIG. 3a; or the protective-layer 23 can extend from the distal end $13_d$ towards or to the proximal end $13_p$ of the array of wires 14, along sides of the wires 13, as shown on wire grid polarizer 40 in FIG. 4. As shown on wire grid polarizer 40 in FIG. 4, the air-filled channels 15 can be retained while allowing some of the protective-layer 23 to extend along sides of the wires 13.

The air-filled channels 15 can have different widths $w_{15}$ or heights $h_{15}$ depending on a thickness of the protective layer 23 along sides of the wires 13. For example, the air-filled channels 15 can have a width $w_{15}$ of at least 25% of a distance D between adjacent wires 13, at least 50% of a distance D between adjacent wires 13, at least 75% of a distance D between adjacent wires 13, or at least 90% of a distance D between adjacent wires 13. The air-filled channels 15 can have a height $h_{15}$ of at least 25% of the height $H_{13}$ of the wires 13, at least 50% of the height $H_{13}$ of the wires 13, at least 75% of the height $H_{13}$ of the wires 13, or at least 90% of the height $H_{13}$ of the wires 13. Because of the low index of refraction of air, it can be beneficial to maintain the air-filled channels 15 as large as possible while also meeting other desired parameters in order to improve optical performance of the wire grid polarizer 30a, 30b, or 40. A choice of wire grid polarizer 30a, 30b, or 40, and the width $w_{15}$ and height $h_{15}$ of the air-filled channels 15, can be made based on available tools for applying the protective layer 23, desired protection of the wires, material of the protective layer 23, and an effect of the protective layer 23 on optical performance.

The protective-layer 23 can be any material that can provide desired protection to the wires, such as physical support, protection of the wires from physical forces that could topple the wires, protection from harmful or corrosive chemicals, or combinations thereof. In one embodiment, the protective-layer 23 can be or can include silicon dioxide. For improved optical performance, it can be helpful for a refractive index of the protective-layer 23 to be close to or the same as a refractive index of the substrate 11. For improved optical performance, it can be helpful in some optical designs for a refractive index of the protective-layer 23 to be relatively low, such as for example less than 1.6, less than 1.5, or less than 1.4.

Reflection of light off of the protective-layer 23 can reduce transmission of a desired polarization (e.g. reduce Tp). As shown in FIG. 3a, to avoid reduced transmission, the wire grid polarizer 30a can further comprise multiple thin-film layers 31 located on the protective-layer 23, on an opposite side of the protective-layer 23 from the array of wires 14. The thin-film layers 31 can extend continuously across the protective-layer 23. By selection of a thickness and material of each layer in the thin-film layers 31, the thin-film layers 31 can reduce reflection of incident light on the protective-layer 23.

Figure 11:
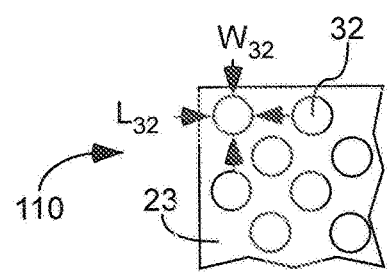
FIG. 11 is a schematic top-view showing part of a wire grid polarizer 110, similar to wire grid polarizers 30b, with an array of protrusions 32 located over the protective-layer 23, in accordance with an embodiment of the present invention.

As shown in FIGS. 3b and 11, to avoid reduced transmission, the wire grid polarizer 30b can further comprise multiple protrusions 32. The protrusions 32 can be formed in an array. The protrusions 32 can be located on the protective-layer 23, on an opposite side of the protective-layer 23 from the array of wires. Each of the protrusions 32 can have various widths $W_{32}$ and lengths $L_{32}$, including for example a width $W_{32}$ and a length $L_{32}$ that are each less than 700 nanometers. Each of the protrusions 32 can have various heights $H_{32}$, including for example a height $H_{32}$ a that is less than <700 nanometers, <300 nanometers, <150 nanometers.

The array of the protrusions 32 can reduce reflection of incident light on the protective-layer 23. Although not shown in the figures, the protrusions can also be located on an opposite surface $11_o$ of the substrate 11, opposite of the surface $11_s$ where the array of wires 14 is located.

Although the protective-layer 23 can provide physical support for the wires 13, and may provide some protection from harmful or corrosive chemicals, the wires 13 may need additional corrosion protection. This added protection may be a chemical coating on an inside surface $15_i$ of the air-filled channels 15. Possible chemical coatings to select for this purpose are described in detail below.

Figure 9:
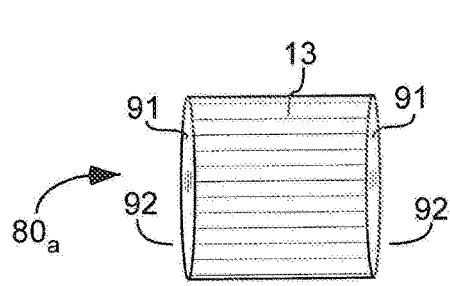
FIGS. 9-10 are schematic top-views of one of the wire grid polarizer parts $80_a$ of FIG. 8, in accordance with embodiments of the present invention.

As shown in FIG. 9, this added protection may be closed ends 92 of the air-filled channels 15. For example, ends 92 of the air-filled channels may be closed by a material 91 such as an adhesive, an epoxy, a polymer, a photocurable material, or combinations thereof.

Figure 10:
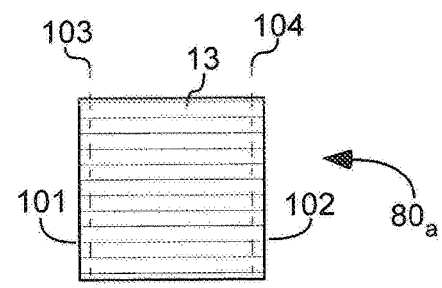

As shown in FIG. 10, this added protection may be damaged wires 13 in a line 103 or 104 parallel to an edge 101 or 102 of the wire grid polarizer $80_a$. The wires can be damaged by a tool that applies pressure to the wires 13 and is drawn across the array of wires 14, perpendicular to their length L. By damaging, the wires 13, wire fragments can block ends of the air-filled channels 15, reducing the chance of water or other chemicals being drawn into the air-filled channels by capillary force.

Chemical Coating

Corrosion protection for the inside surface $15_i$ of the air-filled channels 15 can include a chemical coating on the inside surface $15_i$. This chemical coating can be a hydrophobic coating, such as the silane chemical and/or the phosphonate chemical described below. For improved optical performance, the chemical coating can be a conformal coating, following a contour of the inside surface $15_i$ of the air-filled channels 15 without closing off the air-filled channels.

It can be important to have sufficient thickness of the chemical coating in order to provide sufficient protection to the wires 13. For example, the chemical coating can have a thickness that is at least 0.1 nanometers (nm), at least 0.5 nm, or at least 1 nm. It can be important to have a sufficiently small thickness of the chemical coating in order to avoid or minimize degradation of wire grid polarizer performance. For example, the chemical coating can have a thickness that is Tess than 2 nm, less than 3 nm, less than 5 nm, less than 10 nm, less than 15 nm, or less than 20 nm. The chemical coating can be a monolayer.

The chemical coating can be a phosphonate chemical including:

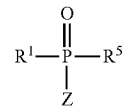

where each $R^1$ can independently be a hydrophobic group, each Z can independently be a bond to the wires 13 or to the protective-layer 23, and $R^5$ can be any suitable chemical element or group. $R^5$ can be a small group, such as for example —$OCH_3$, to allow easier vapor-deposition. Benefits of vapor-deposition are described below. Each $R^5$ can independently be a phosphonate-reactive-group, $R^1$, $R^6$, or an additional bond Z to the wires 13 or to the protective-layer 23. The phosphonate-reactive-group can be a chemical element or group likely to react to form an additional bond Z to the wires 13 or to the protective-layer 23, such as for example —Cl, —OR$^6$, —OCOR$^6$, or —OH. Each R$^6$ can independently be an alkyl group, an aryl group, or combinations thereof.

The chemical coating can be a silane chemical including chemical formula (1), chemical formula (2), or combinations thereof:

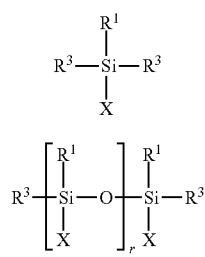

where r can be a positive integer, each X can independently be a bond to the wires 13 or to the protective-layer 23, and each R$^3$ can be independently a chemical element or a group. R$^3$ can be a small group, such as for example—OCH$_3$, to allow easier vapor-deposition. Benefits of vapor-deposition are described below. Each R$^3$ can be independently selected from the group consisting of: a silane-reactive-group, —H, R$^1$, and R$^6$. R$^6$ was defined above. Each silane-reactive-group can be independently selected from the group consisting of: —Cl, —OR$^6$, —OCOR$^6$, —N(R$^6$)$_2$, and —OH. Each R$^1$, as mentioned above, can independently be a hydrophobic group.

Each wire 13 can include different regions of different materials. For example, wires in a selectively-absorptive wire grid polarizer can include an aluminum region and a silicon region. One chemistry can preferentially attach to one of these regions and the other chemistry can preferentially attach to another of these regions; therefore, it can be beneficial to use both the phosphonate chemical and the silane chemical in a single wire grid polarizer.

The hydrophobic group R$^1$ can prevent, minimize the entry of, or minimize the duration of water or other similar liquid chemistry in the air-filled channels 15, and thus protect the air-filled channels 15 from corrosion. The hydrophobic group R$^1$ can be or can include a carbon chain in one aspect and can include at least one halogen bonded to a carbon in another aspect. The carbon chain can include a perfluorinated group including at least 1 carbon atom in one aspect or at least 3 carbon atoms in another aspect. The perfluorinated group can include less than 20 carbon atoms in another aspect, less than 30 carbon atoms in another aspect, or less than 40 carbon atoms in another aspect. It can be beneficial for the perfluorinated group to have at least 4 carbon atoms to provide a hydrophobic chain. It can be beneficial for the perfluorinated group to not be too long or have too many carbon atoms in order to maintain a high enough vapor pressure to allow vapor-deposition.

For example, the carbon chain of R$^1$ can include CF$_3$(CF$_2$)$_n$. Due to the high electronegativity of fluorine, it can be beneficial to have a hydrocarbon chain to separate the perfluorinated group from the phosphorous or sulfur. Thus, the carbon chain of R$^1$ can include CF$_3$(CF$_2$)$_n$(CH$_2$)$_m$. Examples of n include an integer within the boundaries of 0≤n≤20 or 4≤n≤10. Examples of m include an integer within the boundaries of 0≤m≤5 or 2≤m≤5.

Vapor-deposition of the chemical coating may be preferred over immersion because of reduced process-waste disposal problems, reduced health hazards, reduced or no undesirable residue from rinsing, vapor-deposition can be done with standard semiconductor processing equipment, and some wire grid polarizer materials can dissolve during liquid immersion. Non-limiting examples of vapor-deposition methods include chemical vapor-deposition (CVD), low-pressure CVD, plasma-enhanced CVD, physical vapor-deposition, atomic layer deposition, thermoreactive diffusion, electron-beam deposition, sputtering, and thermal evaporation.

In order to allow vapor-deposition, it can be important for some or all of chemistry of the chemical coating to have a relatively low molecular weight, but it can also be important for the carbon chain to be long enough to provide sufficient hydrophobicity. Thus for example, each molecule in the phosphonate chemical coating (excluding the bond Z to the wires 13 or to the protective-layer 23) and each molecule in the silane chemical coating (excluding the bond X to the wires 13 or to the protective-layer 23) can have a molecular weight of at least 100 grams per mole, at least 150 grams per mole, or at least 400 grams per mole, and less than 600 grams per mole, less than 1000 grams per mole, or less than 1500 grams per mole.

In the hydrophobic group R$^1$, it can be important to have a strong bond between silicon (Si) and R$^1$ and between phosphorous (P) and R$^1$ to avoid the R$^1$ group breaking away from Si and P. Thus, the bond between silicon (Si) and R$^1$ can be a silicon to carbon bond (Si—C) and the bond between phosphorous (P) and R can be a phosphorous to carbon bond (P—C).

Image Projector

Figure 5:
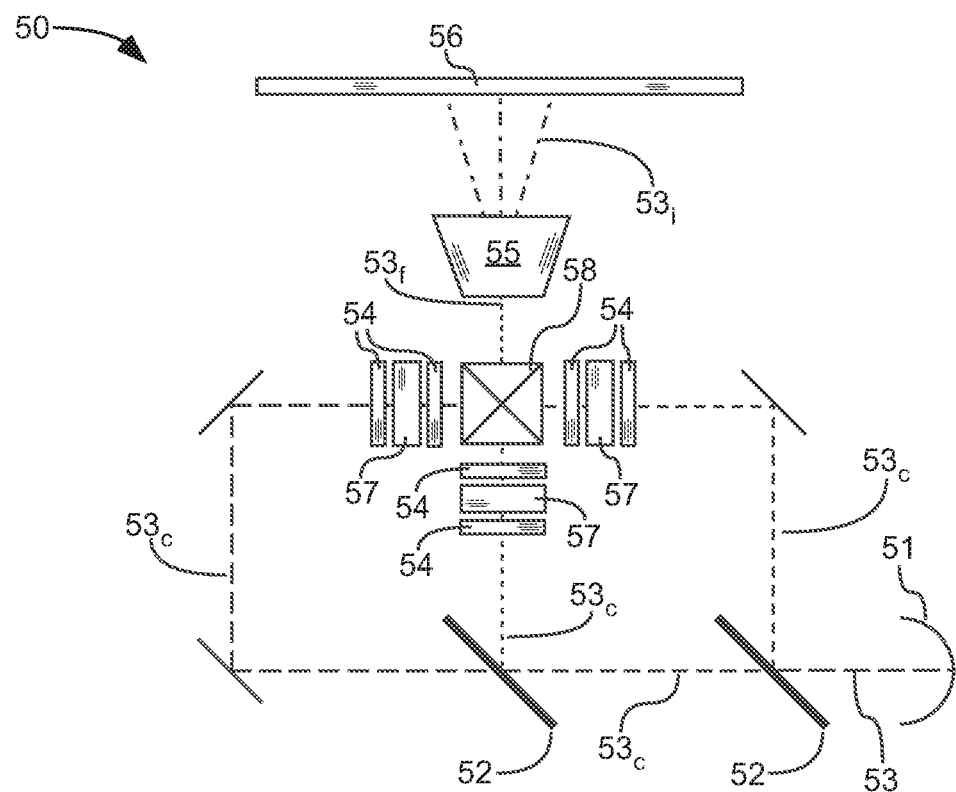
FIGS. 5-6 are schematic top-views of image projectors 50 and 60, each including at least one wire grid polarizer 54, in accordance with embodiments of the present invention.
Figure 6:
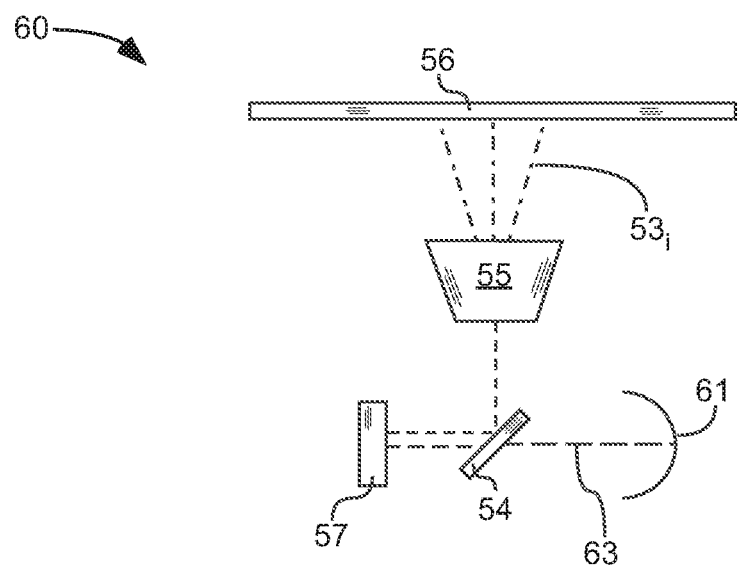

The wire grid polarizers described herein can be used in an image projector, such as for example image projector 50 shown in FIG. 5 or image projector 60 shown in FIG. 6. The image projector 50 or 60 can comprise a light source 51 or 61 capable of emitting a beam of light 53 or 63, a projection lens system 55, spatial light modulator(s) 57, and wire grid polarizer(s) 54 according to wire grid polarizer embodiments described herein.

The projection lens system 55 can be located to receive at least part of the beam of light 53 or 63 and can project an image. Projection lens systems 55 are described in U.S. Pat. Nos. 6,585,378 and 6,447,120, which are hereby incorporated herein by reference in their entirety.

The spatial light modulator 57 can be located to receive, in a light path between the light source 51 or 61 and the projection lens system 55, at least part of the beam of light 53 or 63. The spatial light modulator 57 can have a plurality of pixels, each pixel capable of receiving a signal. The signal can be an electronic signal. Depending on whether or not each pixel receives the signal, or the strength of the signal, the pixel can rotate a polarization of, or transmit or reflect without causing a change in polarization of, the part of the beam of light 53 or 63. The spatial light modulator(s) 57 can include liquid crystal and can be transmissive, reflective, or transflective.

The wire grid polarizer(s) 54 can be located in, at least part of the beam of light 53 or 63 prior to entering the spatial light modulator 57, after exiting the spatial light modulator 57, or both. The wire grid polarizer(s) 54 help form the image by transmitting, reflecting, or absorbing light of each pixel depending, on the type of wire grid polarizer 54 and whether each pixel received the signal.

As shown in FIG. 5, image projector 50 can further comprise color-splitting optics 52 and color-combining optics 58. The light source 51 can emit a beam of light 53, which can initially be unpolarized. The color-splitting optics 52 can be located to receive at least part of the beam of light 53, can be located between the light source 51 and the spatial light modulator 57 and can split the beam of light 53 into multiple, differently-colored light beams, defining colored beams $53_c$. The colored beams $53_c$ can be primary colors.

The color-combining optics 58 can be located between the spatial light modulator 57 and the projection lens system 55 and located to receive at least part of the colored beams $53_c$. The color-combining optics 58 can recombine at least part of the colored beams $53_c$ into a final beam or combined beam $53_f$. Color-combining optics 58 are used in computer projectors for combining different colors of light into a single image to be projected. Color-combining optics 58 are sometimes called X-Cubes, X-Cube prisms, X-prisms, light recombination prisms, or cross dichroic prisms. X-Cubes are typically made of four right angle prisms, with dichroic coatings, that are cemented together to form a cube.

The projection lens system 55 can be located to receive the combined beam $53_f$ and can project a colored image $53_i$. The colored image $53_i$ can be projected onto a screen 56 or into an eye of a person.

The spatial light modulator 57 can be located to receive, in a light path between the color-splitting optics 52 and the color-combining optics 58, at least one of the colored beams $53_c$. The image projector 50 can include a spatial light modulator 57 for each of the colored beams $53_c$. The wire grid polarizer(s) 54 can be located in at least one of the colored beams $53_c$ prior to entering the spatial light modulator 57, after exiting the spatial light modulator 57, or both.

As shown on image projector 60 in FIG. 6, the light source 61 can sequentially emit multiple, differently-colored light beams, defining colored beams 63 (thus the beam of light 61 can be defined as colored beams 63). The colored beams 63 can be primary colors. The projection lens system 55 can be located to receive the colored beams 63 and can project a colored image $53_i$. The colored image $53_i$ can be projected onto a screen 56 or into an eye of a person. The spatial light modulator 57 can be located to receive, in a light path between the light source 61 and the projection lens system 55, the colored beams 63. The wire grid polarizer 54 can be located in the colored beams 63 prior to entering the spatial light modulator 57, after exiting the spatial light modulator 57, or both.

Methods

Figure 7:
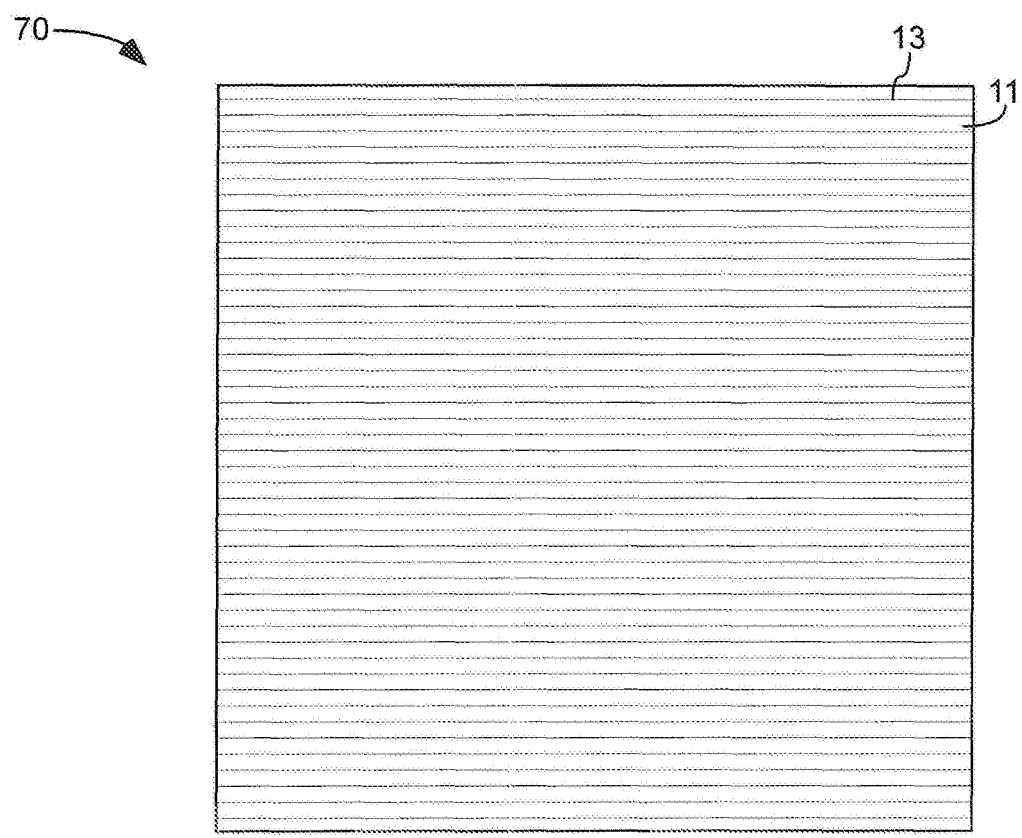
FIG. 7 is a schematic top-view of a wire grid polarizer wafer 70, shown without the protective-layer 23 for clarity, in accordance with an embodiment of the present invention.

A method of protecting wires of a wire grid polarizer can comprise some or all of the following steps, which can be performed in the following order:

1. Providing an array of wires 14 located on a surface $11_s$ of a substrate 11: The array of wires 14 can be substantially-parallel and elongated. Each wire 13 of the array of wires 14 can have a length L parallel to the surface of the substrate 11 and a height $H_{13}$ that is perpendicular to the length L and less than 10% of the length L. The array of wires 14 can include a proximal end $13_p$ of the height $H_{13}$ closer to the substrate 11 and a distal end $13_d$ of the height $H_{13}$ farther from the substrate 11. The array of wires 14 can form air-filled channels 15, including an air-filled channel between adjacent wires 13 of the array of wires 14. The array of wires 14 on the substrate 11 and the air-filled channels 15 can define a wire grid polarizer wafer 70. See FIGS. 1-2 and 7.

2. Applying a protective-layer 23, by physical vapor deposition and/or chemical vapor deposition but excluding atomic layer deposition, onto the distal end $13_d$ of the array of wires 14 and spanning the air-filled channels 15 to provide structural-support for the array of wires 14 and to cap the air-filled channels 15. For example, the protective-layer 23 can be applied by sputtering/sputter deposition, evaporation, atmospheric pressure chemical vapor deposition, high pressure chemical vapor deposition, and low-pressure chemical vapor deposition. Avoiding use of atomic layer deposition can save cost and can avoid filling the air-filled channels 15 with solid material, thus improving wire grid polarizer performance. See FIGS. 3a-4.

3. Applying multiple thin-film layers 31 on the protective-layer 23, the thin-film layers 31 extending continuously across the protective-layer 23 and capable of reducing reflection of incident light on the protective-layer 23. See FIG. 3a.

4. Applying multiple protrusions 32, which can be formed in an array, on the protective-layer 23, the protrusions 32 capable of reducing reflection of incident light on the protective-layer 23. See FIG. 3b.

Figure 8:
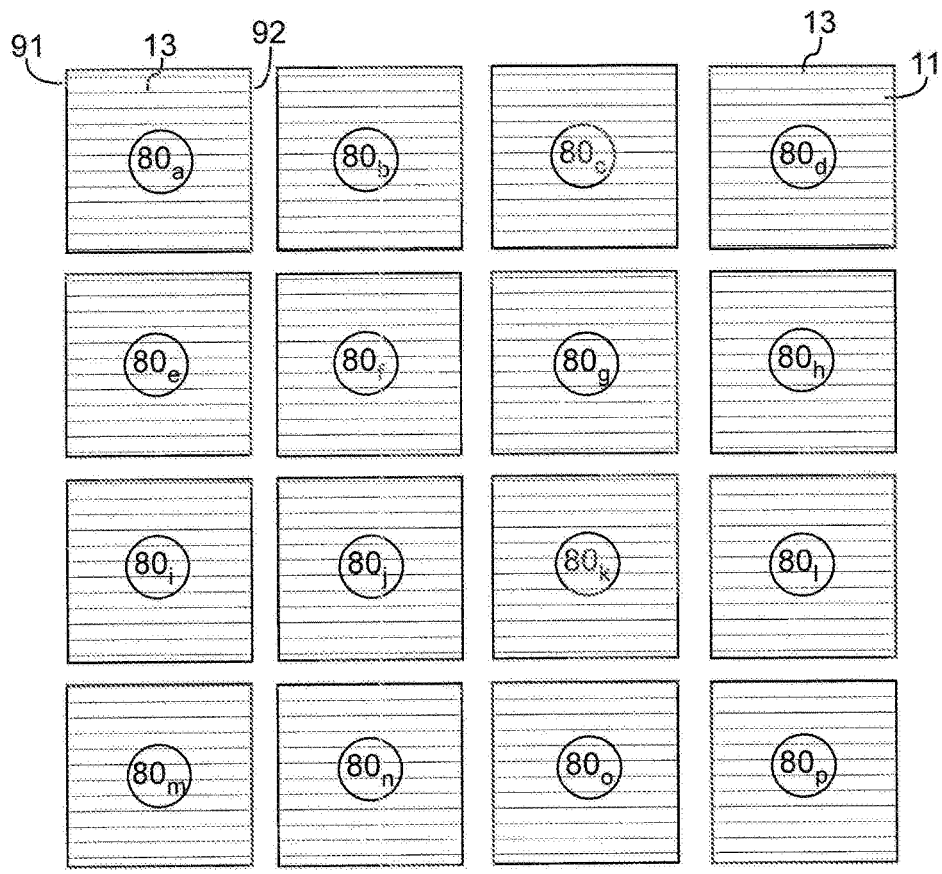
FIG. 8 is a schematic top-view showing the wire grid polarizer wafer 70 of FIG. 6 cut into individual wire grid polarizer parts $80_a$-$80_p$, in accordance with an embodiment of the present invention.

5. Cutting the wire grid polarizer wafer 70 into multiple wire grid polarizer parts $80_a$-$80_p$. See FIGS. 7-8. Note that the protective-layer 23, the thin-film layers 31, and the multiple protrusions 32 are not shown in FIGS. 7-9 and 11 for clarity (i.e. to allow showing the wires 13), but normally some or all of these layers/protrusions would be present at this step.

6. Protecting the array of wires 14 of the wire grid polarizer parts $80_a$-$80_p$ by one or more of the following:
    a) Closing ends 92 of the air-filled channels 15. See FIG. 9. The ends 92 can be closed by various materials 91, including an adhesive, an epoxy, a polymer, a photocurable material, or combinations thereof. Closing ends 92 of the air-filled channels 15 can help prevent water or other harmful chemicals from entering the air-filled channels 15 and damaging the wires.
    b) Coating an inside surface $15_i$ of the air-filled channels 15 as described below.
    c) Damaging the array of wires 14 in a line 103 & 104 parallel to an edge 101 & 102 of the wire grid polarizer parts. See FIG. 10. By damaging the wires 13, capillary forces can be disrupted, thus reducing the chance of water entering the air-filled channels 15. A sharp tool can apply pressure in a fine line perpendicular to the length L of the wires 13, thus damaging the wires. This step of damaging the wires can be done after or simultaneously with cutting the wire grid polarizer wafer 70 into multiple wire grid polarizer parts $80_a$-$80_p$. For example, a single tool can both damage the wires and scribe a line for breaking the wire grid polarizer wafer 70 into separate wire grid polarizer parts $80_a$-$80_p$.

Steps 1 & 2 of the above method can be replaced with: providing a wire grid polarizer wafer 70 with the array of wires 14 located on the surface $11_s$ of a substrate 11, the air-filled channels 15 including an air-filled channel 15 between adjacent wires 13 of the array of wires 14, and the protective-layer 23 located at the distal end $13_d$ of the array of wires 14 and spanning the air-filled channels 15.

The order of the steps in the prior method can be important. It can be important to apply the protective layer 23 prior to protecting the array of wires 14 because material for protecting the array of wires 14 may be destroyed by the process of applying the protective-layer 23, or may be covered by the protective-layer 23. In some embodiments, it can be important to cut the wire grid polarizer wafer 70 prior to protecting the array of wires because (a) some of the protective methods for protecting the array of wires 14, such as closing ends of the air-filled channels 15 might be incomplete if done prior to cutting the wire grid polarizer wafer 70, and (b) it would be difficult to cause the chemical coating to travel far enough through air-filled channels 15 of an entire wire grid polarizer wafer 70, but easier for such chemical to travel far enough through air-filled channels 15 of the smaller cut parts 80$_a$-80$_p$.

The wire grid polarizer, the array of wires 14, the air-filled channels 15, and protective-layer 23 can have the properties described above. Coating the inside surface 15$_i$ of the air-filled channels 15 can include coating by vapor deposition. Coating the inside surface 15$_i$ of the air-filled channels 15 can include deposition of a silane chemical including Si(R$^1$)$_d$(R$^2$)$_e$(R$^3$)$_g$ and/or deposition of a phosphonate chemical including (R$^1$)$_i$PO(R$^4$)$_j$(R$^5$)$_k$ where:

d is 1, 2, or 3, e is 1, 2, or 3, g is 0, 1, or 2, and d+e+g=4; i is 1 or 2, j is 1 or 2, k is 0 or 1, and i+j+k=3;

each R$^1$ can independently be a hydrophobic group;

R$^2$ can be a silane-reactive-group and each silane-reactive-group can independently be selected from —Cl, —OR$^6$, —OCOR$^6$, —N(R$^6$)$_2$, and —OH;

R$^4$ can be a phosphonate-reactive-group and each phosphonate-reactive group can independently be selected from —Cl, —OR$^6$, —OCOR$^6$, and —OH;

each R$^6$ can independently be an alkyl group, an aryl group, or combinations thereof;

each R$^3$, if any, can independently be any chemical element or group; and each R$^5$, if any, can independently be any chemical element or group.

Additional properties of the silane chemical and the phosphonate chemical are described above. If both the silane chemical and the phosphonate chemical are applied, they can be applied sequentially or simultaneously.

Additional, optional steps in the method, between the steps of cutting the wire grid polarizer wafer into multiple wire grid polarizer parts 80$_a$-80$_p$ and protecting the array of wires 14 of the wire grid polarizer parts 80$_a$-80$_p$, can include the following, which can be performed in the following order:

1. Exposing the wire grid polarizer parts 80$_a$-80$_p$ to ultraviolet light and/or ozone, which can generate more reactive groups on the surface, thus improving bonding of the chemical coating. Exposing the wire grid polarizer parts 80$_a$-80$_p$ to ultraviolet light and ozone can be done sequentially or simultaneously. Examples of duration of this step include less than two minutes or less than 20 minutes.

2. Plasma cleaning the wire grid polarizer parts 80$_a$-80$_p$. Plasma, cleaning can generate more reactive groups on the surface, thus improving bonding of the chemical coating. Non-limiting examples of plasmas include $O_2$, $H_2$, Ar, and $N_2$. Plasma cleaning can be performed at various temperatures, such as for example between 140° C. and 200° C. One plasma, used, for cleaning the wire grid polarizer, included $O_2$ (flow rate 15 sccm) and $H_2$ (flow rate 10 sccm) at a power of 400 W for 5 minutes at a temperature of 160° C. The unit "sccm" means cubic centimeters per minute at 0° C. and 1 atmosphere pressure.

3. Exposing the wire grid polarizer to a gas. The gas can include water vapor. The water vapor can have a pressure of less than 100 Torr. This step can increase the number of hydroxyl groups on the underlying surface, which can improve bonding of the silane chemical and/or the phosphonate chemical. Duration, pressure, and temperature of this step may need to be carefully limited, depending on the wire 13 material composition in order to avoid corrosion.

An additional, optional step in the method, after protecting the array of wires 14 of the wire grid polarizer parts 80$_a$-80$_p$ by coating an inside surface 15$_i$ of the air-filled channels 15, can include baking the wire grid polarizer parts 80$_a$-80$_p$. Baking can improve bonding of the chemical coating. Examples of baking temperature include greater than 100° C., greater than 130° C., or greater than 150° C.; and less than 300° C., less than 320° C., or less than 400° C. Examples of baking time include at least 5 minutes, at least 10 minutes, and less than 60 minutes or less than 90 minutes. Baking at 150° C. for 15 minutes has been successful.

What is claimed is:

1. A method of protecting wires of a wire grid polarizer, the method comprising the following steps in the following order:
   a) providing a wire grid polarizer wafer with:
      i) an array of wires located on a surface of a substrate, the array of wires being substantially-parallel and elongated, each wire of the array of wires having a length parallel to the surface of the substrate and a height that is perpendicular to the length and less than 10% of the length, the array of wires including a proximal end of the height closer to the substrate and a distal end of the height farther from the substrate;
      ii) a plurality of air-filled channels, including an air-filled channel between adjacent wires of the array of wires; and
      iii) a protective-layer located at the distal end of the array of wires and spanning the air-filled channels, the protective-layer providing structural-support for the array of wires and capping the air-filled channels;
   b) cutting the wire grid polarizer wafer into multiple wire grid polarizer parts;
   c) protecting the array of wires of the wire grid polarizer parts by coating an inside surface of the air-filled channels with a conformal coating having a thickness that is at least 0.1 nm and less than 20 nm and including vapor deposition of a silane chemical including Si(R$^1$)$_d$(R$^2$)$_e$(R$^3$)$_g$ and vapor deposition of a phosphonate chemical including (R$^1$)$_i$PO(R$^4$)$_j$(R$^5$)$_k$ where d is 1, 2, or 3, e is 1, 2, or 3, g is 0, 1, or 2, and d+e+g=4; i is 1 or 2, j is 1 or 2, k is 0 or 1, and i+j+k=3; each R1 is independently a hydrophobic group; R2 is a silane-reactive-group; each silane-reactive-group is independently selected from: —Cl, —OR$^6$, —OCOR$^6$, —N(R$^6$)$_2$, and —OH; R$^4$ is a phosphonate-reactive-group; each phosphonate-reactive-group is independently selected from: —Cl, —OR$^6$, —OCOR$^6$, and —OH; each R$^6$ is independently an alkyl group, an aryl group, or combinations thereof; each R$^3$, if any, is independently any chemical element or group; and each R$^5$, if any, is independently any chemical element or group; and
   d) applying multiple thin-film layers on the protective-layer, the thin-film layers extending continuously across the protective-layer and capable of reducing reflection of incident light on the protective-layer.

2. The method of claim 1, further comprising baking the wire grid polarizer.

3. The method of claim 1, wherein each R$^1$ is CF$_3$(CF$_2$)$_n$(CH$_2$)$_m$, n is an integer within the boundaries of 1≤n≤3 and m is an integer within the boundaries of 1≤m≤5.

4. A method of protecting wires of a wire grid polarizer, the method comprising the following steps in the following order:

a) providing a wire grid polarizer wafer with:
   i) an array of wires located on a surface of a substrate, the array of wires being substantially-parallel and elongated, each wire of the array of wires having a length parallel to the surface of the substrate and a height that is perpendicular to the length and less than 10% of the length, the array of wires including a proximal end of the height closer to the substrate and a distal end of the height farther from the substrate;
   ii) a plurality of air-filled channels, including an air-filled channel between adjacent wires of the array of wires; and
   iii) a protective-layer located at the distal end of the array of wires and spanning the air-filled channels, the protective-layer providing structural-support for the array of wires and capping the air-filled channels;
b) cutting the wire grid polarizer wafer into multiple wire grid polarizer parts;
c) protecting the array of wires of the wire grid polarizer parts by coating an inside surface of the air-filled channels with a conformal coating having a thickness that is at least 0.1 nm and less than 20 nm and including deposition of a silane chemical including $Si(R^1)d(R^2)e(R^3)g$, where: d is 1, 2, or 3, e is 1, 2, or 3, g is 0, 1, or 2, and d+e+g=4; breach $R^1$ is independently a hydrophobic group and includes $CF_3(CF_2)_n$, n is an integer within the boundaries of $0 \le n \le 4$; $R^2$ is a silane-reactive-group; each silane-reactive-group is independently selected from: —Cl, —$OR^6$, —$OCOR^6$, —$N(R^6)_2$, and —OH; each $R^6$ is independently an alkyl group, an aryl group, or combinations thereof; and each $R^3$, if any, is independently any chemical element or group; and
d) applying multiple thin-film layers on the protective-layer, the thin-film layers extending continuously across the protective-layer and capable of reducing reflection of incident light on the protective-layer.

5. The method of claim 4, wherein each $R^1$ is $CF_3(CF_2)_n(CH_2)_m$, n is an integer within the boundaries of $1 \le n \le 3$ and m is an integer within the boundaries of $1 \le m \le 5$.

6. The method of claim 4, further comprising baking the wire grid polarizer at a temperature of greater than 130° C. and less than 320° C.

7. The method of claim 4, further comprising exposing the wire grid polarizer to water vapor, between the steps of cutting the wire grid polarizer wafer and protecting the array of wires, the water vapor having a pressure of less than 100 Torr.

8. The method of claim 4, further comprising plasma cleaning the wire grid polarizer, between the steps of cutting the wire grid polarizer wafer and protecting the array of wires.

9. The method of claim 4, further comprising exposing the wire grid polarizer to ultraviolet light, ozone, or both, between the steps of cutting the wire grid polarizer wafer and protecting the array of wires.

10. A method of protecting wires of a wire grid polarizer, the method comprising the following steps in the following order:
a) providing a wire grid polarizer wafer with:
   i) an array of wires located on a surface of a substrate, the array of wires being substantially-parallel and elongated, each wire of the array of wires having a length parallel to the surface of the substrate and a height that is perpendicular to the length and less than 10% of the length, the array of wires including a proximal end of the height closer to the substrate and a distal end of the height farther from the substrate;
   ii) a plurality of air-filled channels, including an air-filled channel between adjacent wires of the array of wires; and
   iii) a protective-layer located at the distal end of the array of wires and spanning the air-filled channels, the protective-layer providing structural-support for the array of wires and capping the air-filled channels;
b) cutting the wire grid polarizer wafer into multiple wire grid polarizer parts;
c) protecting the array of wires of the wire grid polarizer parts by coating an inside surface of the air-filled channels with a conformal coating having a thickness that is at least 0.1 nm and less than 20 nm and including deposition of a phosphonate chemical including $(R^1)_i PO(R^4)_j(R^5)_k$, where: i is 1 or 2, j is 1 or 2, k is 0 or 1, and i+j+k=3; each $R^1$ is independently a hydrophobic group; $R^4$ is a phosphonate-reactive-group; each phosphonate-reactive-group is independently selected from: —Cl, —$OR^6$, —$OCOR^6$, and —OH; each $R^6$ is independently an alkyl group, an aryl group, or combinations thereof; and each $R^5$, if any, is independently any chemical element or group; and
d) applying multiple thin-film layers on the protective-layer, the thin-film layers extending continuously, across the protective-layer and capable of reducing reflection of incident light on the protective-layer.

11. The method of claim 10, wherein each $R^1$ is $CF_3(CF_2)_n(CH_2)_m$, n is an integer within the boundaries of $1 \le n \le 3$ and m is an integer within the boundaries of $1 \le m \le 5$.

12. The method of claim 10, wherein each $R^1$ is $CF_3(CF_2)_n(CH_2)_m$, n is an integer within the boundaries of $1 \le n \le 3$ and m is an integer within the boundaries of $1 \le m \le 5$.

13. The method of claim 10, further comprising exposing the wire grid polarizer to water vapor, between the steps of cutting the wire grid polarizer wafer and protecting the array of wires, the water vapor having a pressure of less than 100 Torr.

14. A wire grid polarizer, comprising:
a) an array of wires located on a surface of a substrate, the array of wires being substantially-parallel and elongated, each wire of the array of wires having a length parallel to the surface of the substrate and a height that is perpendicular to the length and less than 10% of the length, the array of wires including a proximal end of the height closer to the substrate and a distal end of the height farther from the substrate;
b) a plurality of air-filled channels, including an air-filled channel between adjacent wires of the array of wires;
c) a protective-layer located at the distal end of the array of wires and spanning the air-filled channels, the protective-layer providing structural-support for the array of wires and capping the air-filled channels; and
d) a conformal coating, having a thickness that is at least 0.1 nm and less than 20 nm, on an inside surface of the air-filled channels, the conformal coating comprises a silane chemical including chemical formula (1), chemical formula (2), or combinations thereof:

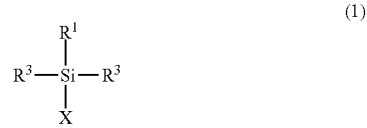

(1)

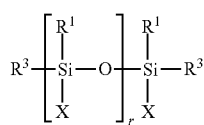
(2)

where: r is a positive integer; each $R^1$ independently is a hydrophobic group and includes $CF_3(CF_2)_n$, n is an integer within the boundaries of $0 \leq n \leq 4$; X is a bond to the wires, a bond to the protective-layer, or both; and each $R^3$ is independently a chemical element or a group.

15. The wire grid polarizer of claim 14, further comprising multiple thin-film layers located on the protective-layer, on an opposite side of the protective-layer from the array of wires, the thin-film layers extending continuously across the protective-layer and capable of reducing reflection of incident light on the protective-layer.

16. The wire grid polarizer of claim 14, further comprising protrusions, formed in an array, located on the protective-layer, on an opposite side of the protective-layer from the array of wires, each protrusion having a width and a length that are less than 700 nanometers, and capable of reducing reflection of incident light on the protective-layer.

17. The wire grid polarizer of claim 14, wherein each $R^1$ is $CF_3(CF_2)_n(CH_2)_m$, n is an integer within the boundaries of $1 \leq n \leq 3$ and m is an integer within the boundaries of $1 \leq m \leq 5$.

18. A wire grid polarizer, comprising:
a) an array of wires located on a surface of a substrate, the array of wires being substantially-parallel and elongated, each wire of the array of wires having a length parallel to the surface of the substrate and a height that is perpendicular to the length and less than 10% of the length, the array of wires including a proximal end of the height closer to the substrate and a distal end of the height farther from the substrate;
b) a plurality of air-filled channels, including an air-filled channel between adjacent wires of the array of wires;
c) a protective-layer located at the distal end of the array of wires and spanning the air-filled channels, the protective-layer providing structural-support for the array of wires and capping the air-filled channels; and
d) a conformal coating, having a thickness that is at least 0.1 nm and less than 20 nm, on an inside surface of the air-filled channels, comprising a phosphonate chemical including:

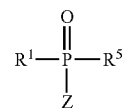

where: each $R^1$ independently includes a hydrophobic group and includes $CF_3(CF_2)_n$, n is an integer within the boundaries of $0 \leq n \leq 4$; Z is a bond to the wires, a bond to the protective-layer, or both; and $R^5$ is a chemical element or a group.

19. The wire grid polarizer of claim 18, wherein each $R^1$ is $CF_3(CF_2)_n(CH_2)_m$, n is an integer within the boundaries of $1 \leq n \leq 3$ and m is an integer within the boundaries of $1 \leq m \leq 5$.

20. The wire grid polarizer of claim 18, further comprising multiple thin-film layers located on the protective-layer, on an opposite side of the protective-layer from the array of wires, the thin-film layers extending continuously across the protective-layer and capable of reducing reflection of incident light on the protective-layer.

* * * * *